(12) United States Patent
Yamashita et al.

(10) Patent No.: US 9,881,952 B2
(45) Date of Patent: *Jan. 30, 2018

(54) LEVEL SHIFTER CIRCUIT AND METHOD

(71) Applicant: TAIWAN SEMICONDUCTOR MANUFACTURING COMPANY, LTD., Hsinchu (TW)

(72) Inventors: Yuichiro Yamashita, Hsinchu (TW); Po-Sheng Chou, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/146,110

(22) Filed: May 4, 2016

(65) Prior Publication Data

US 2016/0247845 A1 Aug. 25, 2016

Related U.S. Application Data

(63) Continuation of application No. 14/295,047, filed on Jun. 3, 2014, now Pat. No. 9,362,320.

(51) Int. Cl.
*H01L 27/146* (2006.01)
*H01L 49/02* (2006.01)

(52) U.S. Cl.
CPC .... *H01L 27/14609* (2013.01); *H01L 27/1464* (2013.01); *H01L 27/1469* (2013.01); *H01L 27/14605* (2013.01); *H01L 27/14612* (2013.01); *H01L 27/14634* (2013.01); *H01L 27/14636* (2013.01); *H01L 27/14689* (2013.01); *H01L 28/40* (2013.01); *H01L 27/14627* (2013.01)

(58) Field of Classification Search
CPC .. H04N 5/3597; H04N 5/3698; H04N 5/3741; H04N 5/378; H01L 27/146–27/14893; H01L 28/40; G09G 2300/0838; G09G 2300/0871

See application file for complete search history.

(56) References Cited

U.S. PATENT DOCUMENTS

| 7,515,185 B2 | 4/2009 | Nakamura | |
|---|---|---|---|
| 2008/0083939 A1* | 4/2008 | Guidash | H01L 27/14634 257/292 |
| 2010/0140732 A1* | 6/2010 | Eminoglu | H01L 27/14634 257/447 |
| 2010/0141818 A1* | 6/2010 | Kinugasa | G02B 7/36 348/300 |
| 2011/0012644 A1* | 1/2011 | Chiu | G11C 27/026 327/94 |
| 2014/0240565 A1* | 8/2014 | Murakami | H04N 5/378 348/302 |

* cited by examiner

*Primary Examiner* — Lin Ye
*Assistant Examiner* — Chriss Yoder, III
(74) *Attorney, Agent, or Firm* — Hauptman Ham, LLP

(57) ABSTRACT

A circuit includes a photodiode electrically coupled to a first node, the first node configured to be charged by a first power supply voltage. A second node is configured to be charged by a second power supply voltage lower than the first power supply voltage, a source follower transistor is electrically coupled between the second node and a column line, and a level shifter is electrically coupled between the first node and the second node.

20 Claims, 14 Drawing Sheets

LEVEL SHIFTER CIRCUIT AND METHOD

PRIORITY CLAIM

The present application is a continuation of U.S. application Ser. No. 14/295,047, filed Jun. 3, 2014, which is incorporated herein by reference in its entirety.

BACKGROUND

Device manufacturers are challenged to deliver quality integrated circuits such as image sensors that consume a minimal amount of power while offering maximum device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
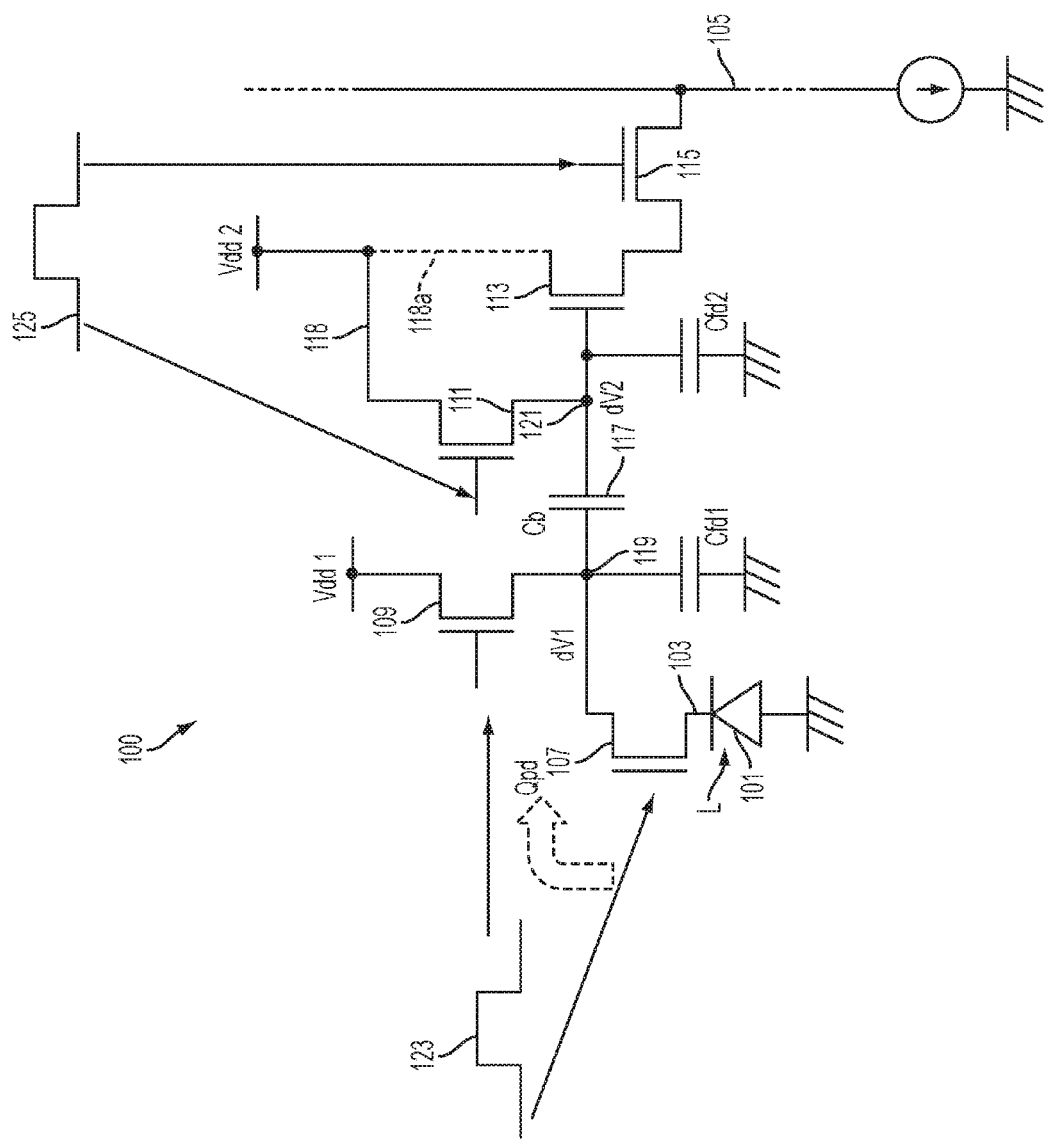
FIG. 1 is a schematic diagram of an integrated circuit, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Active-pixel image sensors are often used in image devices such as cameras, video recorders, or other image capturing devices. Some active-pixel sensors are formed of charge-coupled devices (CCDs). As an alternative, active-pixel sensors are sometimes formed of photodiodes using complementary metal-oxide-semiconductor (CMOS) processes.

CMOS image sensors are gaining in popularity over traditional CCDs due to certain advantages inherent in CMOS image sensors. In particular, CMOS image sensors typically require lower voltages, consume less power, enable random access to image data, are capable of being fabricated with compatible CMOS processes, and enable integrated single-chip cameras. Generally, CMOS image sensors utilize light-sensitive CMOS circuitry to convert light energy into electrical energy. The light-sensitive CMOS circuitry typically includes a photodiode formed on a silicon substrate. As the photodiode is exposed to light, an electrical charge is induced in the photodiode. The photodiode is typically coupled to a MOS switching transistor, which is used to sample the charge of the photodiode.

Typically, CMOS image sensors are fabricated utilizing a capacitance within the photodiode and a floating capacitance created between transistor connections. These capacitances, however, are characterized by small capacitance values, which usually cause a high susceptibility to noise and reduce the maximum of an output signal. Attempts have been made to increase the signal generated by a photodiode, but these increase the electrical charge generated by the photodiode and do not necessarily increase the output signal. Furthermore, CMOS image sensors are typically fabricated utilizing MOS transistors having a polysilicon gate and silicon nitride spacers. This type of transistor, however, introduces a silicon surface trap and leakage issues. As a result, noise on the output signal increases, as does a dark signal that, for example, occurs when no light is received by the image sensor.

CMOS image sensors are sometimes arranged as four transistor (4T) pixels. In 4T pixels, a collected photo charge is integrated on a photodiode, but during readout, the charge is transferred to a floating diffusion node. A floating diffusion capacitance corresponding to the floating diffusion node defines a charge to voltage conversion gain. The charge transfer in the 4T pixel transfers all charge, and thus does not introduce noise. 4T pixels cancel reset noise by correlated double sampling (CDS) without the need for an external memory. But, for a complete charge transfer, the floating diffusion node needs to be set to a high voltage, which increases power consumption. For example, if a conventional 4T-type CMOS image sensor is used in an integrated circuit, to complete charge transfer from the photodiode, the floating diffusion node is sometimes biased to have a high enough voltage, e.g., ~3.0V, to complete the transfer. To realize a sufficient input dynamic range of the source follower transistor, the source follower power is also often biased to have a high enough voltage (e.g., ~3.0V). Dynamic range is the ratio between the smallest and largest possible values read out from an image sensor. The higher the dynamic range of a pixel, the greater the signal resolution is (assuming fixed minimum and maximum detectable light levels). Dynamic range is related to the signal-to-noise ratio of the pixel.

FIG. 1 is a schematic diagram of an integrated circuit 100 that makes it possible to reduce a gate voltage of a source follower transistor, which in turn makes it possible to reduce power consumption, in accordance with one or more embodiments.

Integrated circuit 100 is an image sensor that comprises a photodiode 101 configured to sense light L and to generate a current from the sensed light L. In some embodiments, the integrated circuit 100 is, or comprises, a pixel structure. The photodiode 101 has a photodiode output 103 that is electrically coupled to a column line 105. A transfer transistor 107 is between the photodiode output 103 and the column line 105. The transfer transistor 107 has a transfer transistor gate, a transfer transistor input and a transfer transistor output.

A first reset transistor 109 is between the photodiode output 103 and the column line 105. The first reset transistor 109 has a first reset transistor gate, a first reset transistor input and a first reset transistor output. A second reset transistor 111 is between the photodiode output 103 and the column line 105. The second reset transistor 111 has a second reset transistor gate, a second reset transistor input and a second reset transistor output. A source follower transistor 113 is between the photodiode output 103 and the column line 105. The source follower transistor 113 has a source follower gate, a source follower input and a source follower output. A select transistor 115 is between the source follower output and the column line 105. The select transistor 115 has a select transistor gate, a select transistor input and a select transistor output. In some embodiments, the source follower transistor 113 is, or is a part of, an amplifier.

A level shifter 117 is between the photodiode output 103 and the source follower input of the source follower transistor 113. In some embodiments, the level shifter 117 is a passive level shifter that is or comprises a capacitor. In some embodiments the capacitor of the level shifter 117 is a metal-oxide-metal capacitor. In other embodiments, the capacitor of the level shifter 117 is a metal-insulator-metal capacitor.

In some embodiments, one or more of the first reset transistor 109, the second reset transistor 111, the source follower transistor 113 or the select transistor 115 are PMOS transistors. In other embodiments, one or more of the first reset transistor 109, the second reset transistor 111, the source follower transistor 113 or the select transistor 115 are NMOS transistors.

Circuit elements such as the photodiode 101, column line 105, transfer transistor 107, first reset transistor 109, second reset transistor 111, source follower transistor 113, select transistor 115 and level shifter 117 are electrically coupled to one another by way of a series of electrical connections 118 such as one or more of the other circuit elements, metal interconnects, metal contacts, metal pads, various nodes, or other suitable circuitry that comprises a conductive material that makes it possible to electrically connect one or more circuit elements. In some embodiments, circuit elements and/or the electrical connections are formed, for example, inside, under, or over, a dielectric layer and/or a passivation layer on a substrate. If the source follower transistor 113 is a PMOS transistor, electrical connection 118a is optionally excluded from integrated circuit 100.

The transfer transistor 107 is electrically coupled to the photodiode 101 and to the column line 105 between the photodiode output 103 and the column line 105. The first reset transistor 109 is electrically coupled to the photodiode 101 and to the column line 105 at a first node 119. The first node 119 is between the transfer transistor 107 and the column line 105. The second reset transistor 111 is electrically coupled to the photodiode 101 and to the column line 105 at a second node 121. The first node 119 and the second node 121 are floating diffusion nodes. The second node 121 is between the first node 119 and the column line 105. The source follower transistor 113 is electrically coupled to the photodiode 101 and to the column line 105 between the second node 121 and the column line 105. The level shifter 117 is electrically coupled to the photodiode 101 and to the column line 105 between the first node 119 and the second node 121.

In use, a first logic high signal 123 is applied to the gate of the transfer transistor 107 or to the gate of the first reset transistor 109, and a second logic high signal 125 is applied to the select transistor 115 or to the second reset transistor 111. To reset the first node 119 and the second node 121, the first logic high signal 123 is applied to the gate of the first reset transistor 109, turning on the first reset transistor 109, and the second logic high signal 125 is applied to the gate of the second reset transistor 111, turning on the second reset transistor 111. In a light sensing operation, the first logic high signal 123 is applied to the gate of the transfer transistor 107, turning on the transfer transistor 107, and the second logic high signal 125 is applied to the gate of select transistor 115, turning on the select transistor 115.

If the first logic high signal 123 is applied to the gate of the first reset transistor 109, photodiode 101 is reverse-biased by a first power supply voltage Vdd_1. Under the reverse bias by first power supply voltage Vdd_1, a depletion region within the photodiode 101 is generated. Accordingly, photodiode 101 acts as a capacitor that is charged by first power supply voltage Vdd_1. First node 119 is thus charged to a first high voltage by the first power supply voltage Vdd_1. The first reset transistor 109 is then turned off by ceasing the application of the first logic high signal 123 to the gate of the first reset transistor 109, and the first charges are stored at first node 119. Level shifter 117 is also charged by first power supply voltage Vdd_1 such that a charge is stored at the level shifter 117.

If the second logic high signal 125 is applied to the gate of the second reset transistor 111, second node 121 is charged to a second high voltage by a second power supply voltage Vdd_2. The second reset transistor 111 is then turned off by ceasing the application of the second logic high signal 125 to the gate of the second reset transistor 111, and the second charge is stored at second node 121.

During the light sensing operation, the first logic high signal 123 is applied to the gate of the transfer transistor 107, and the photodiode 101 may or may not be exposed to light L. If photodiode 101 is exposed to light L, electron-hole pairs are generated in the depletion region within the photodiode 101. The first charge stored at the first node 119 is thus discharged to the ground by a current flowing through photodiode 101, and the voltage at first node 119 is brought down. If, however, photodiode 101 is not exposed to light L, no electron-hole pair is generated in the depletion region within the photodiode 101, and the first charge stored at first node 119 remains. Accordingly, the voltage at first node 119 is higher if the photodiode 101 is not exposed to light L than if photodiode 101 is exposed to light L. If a voltage difference is determined to exist at the first node 119, between a first voltage determination at the first node 119 and a second voltage determination at the first node 119, this voltage difference is capable of being used to determine whether the photodiode 101 is exposed to light L or not.

Similarly, the second charge stored at the second node 121 is discharged to the ground by the current flowing through photodiode 101, and the voltage at second node 121 is brought down. If, however, photodiode 101 is not exposed to light L, no electron-hole pair is generated in the depletion region within the photodiode 101, and the second charge stored at second node 121 remains. Accordingly, the voltage at second node 121 is higher if the photodiode 101 is not exposed to light L than if photodiode 101 is exposed to light L. If a voltage difference is determined to exist at the second node 121, between a first voltage determination at the second node 121 and a second voltage determination at the second node 121, this voltage difference is capable of being used to determine whether the photodiode 101 is exposed to light L or not.

The first charges at first node 119 and the level shifter 117, and the second charges at the second node 121, affect the operation of source follower transistor 113, which acts as an amplifier amplifying the state at second node 121 without draining the charges at the second node 121. If photodiode 101 is exposed to light L, the voltage at the select transistor input of the select transistor 115 will be lower than the voltage at the second node 121. If the photodiode 101 is not exposed to light L, then the voltage at the select transistor input of the select transistor 115 will be higher than the voltage at the second node 121.

During the light sensing operation, the second logic high signal 125 is applied to the gate of the select transistor 115, and the select transistor 115 is turned on to connect the select transistor input of the select transistor 115 to the column line 105. Accordingly, the voltage at the column line 105 is the voltage at the select transistor output of the select transistor 115, which indicates whether photodiode 101 is exposed to light L or not. The voltage of the select transistor 115 output is about the same as the select transistor 115 input, which is about the same as the source follower transistor 113 output.

The level shifter 117 makes it possible for the second power supply voltage Vdd_2 to be less than the first power supply voltage Vdd_1, which reduces an overall power consumption of the integrated circuit 100. The second power supply voltage Vdd_2 is capable of being less than the first power supply voltage Vdd_1, because the level shifter 117 is configured to store a charge that makes it possible for the source follower transistor 113 to be powered by a lower supply voltage as compared to the first reset transistor 109.

For example, if the first logic high signal 123 ranges between 0V and 5V, the first power supply voltage Vdd_1 corresponds to the first logic high signal 123 and supplied a first power supply voltage Vdd_1 that is 5V. But, because the level shifter 117 stores a charge that makes it possible for the source follower transistor 113 to be powered by a lower supply voltage, the second logic high signal 125 is sufficient, for example, in a range of about 0V to about 1.2V volts, and the second supply voltage Vdd_2 is sufficient, for example, to supply a voltage of about 1.2V.

Because the second power supply voltage Vdd_2 is capable of being less than the first power supply voltage Vdd_1, the source follower transistor 113 is capable of consuming less power than if the source follower transistor 113 were supplied the same power supply voltage as the first reset transistor 109. In some embodiments, the overall power consumption of the integrated circuit 100 is proportionally related to the power supplied to the source follower transistor 113. Further, with the first power supply voltage Vdd_1 being allowed to remain higher than the second power supply voltage Vdd_2, the first node 119 is charged to a higher voltage than that which is supplied to the source follower transistor 113, which makes it possible to complete the charge transfer while consumes less power overall.

Additionally, if the first power supply voltage Vdd_1 is greater than the second power supply voltage Vdd_2, meaning that the charge stored at the first node 119 is greater than the voltage supplied to the source follower transistor 113, then the integrated circuit 100 will have an increased full well capacity.

In some embodiments, the first node 119 has a corresponding first floating diffusion node capacitance Cfd1 and the second node 121 has a corresponding second floating diffusion node capacitance Cfd2. A signal level is determinable at each of the first node 119, the second node 121, and the source follower output of the source follower transistor 113 which are determinable as indicated in Table 1-1. The determinable signal level is based, at least in part, on a number of signal electrons Qpd at the photodiode 101 after the charges at the first node 119 and the second node 121 are reset, and after the first logic high signal 123 is applied to the gate of the transfer transistor 107. The signal level at the source follower output of the source follower transistor 113 is additionally based on a transfer conductance Gsf and a predetermined threshold voltage Vth.

In Table 1-1, the first node 119 corresponds to FD1, second node 121 corresponds to FD2, and the source follower output of the source follower transistor 113 corresponds to SF out:

TABLE 1-1

| Signal Electrons | FD1 | FD2 | SF out |
| --- | --- | --- | --- |
| After Reset | 0 | Vdd_1 | Vdd_2 | Gsf × Vdd_2 − Vth |
| After Transfer | Qpd | Vdd_1 − dV1 | Vdd_2 − dV2 | Gsf × (Vdd_2 − DV2) − Vth |

The following formulas are used to determine the values included in Table 1-1:

$$dV1 = \frac{Qpd}{Cfd1 + Cb//Cfd2} \quad (1)$$

$$= \frac{Qpd}{Cfd1 + kCfd2} \quad (2)$$

$$k = \frac{1}{1 + Cfd2/Cb} \quad (3)$$

$$dV2 = \frac{kQpd}{Cfd1 + kCd2} \quad (4)$$

After the charges at the first node 119 and the second node 121 are reset, but before the first logic high signal 123 is applied to the gate of the transfer transistor 107, the signal level is 0, because there are no signal electrons flowing from the photodiode 101 and/or the transfer transistor 107 to the first node 119, the second node 121, or the source follower output of the source follower transistor 113. But when the first logic high signal 123 is applied to the gate of the transfer transistor 107, the signal electrons flowing from the photodiode 101 and/or the transfer transistor 107 is Qpd.

The largest charge that can be stored in the photodiode 101 is the full well capacity or maximum full well capacity (MFWC), which is given by:

$$Q=CV \quad (5)$$

The photodiode capacitance C, which is one or more of the capacitance of the photodiode 101, the first floating diffusion capacitance Cfd1, or the second floating diffusion capacitance Cfd2, individual or combined, is fixed and includes parasitic capacitance values of parasitic capacitances that could exist among the circuit components of integrated circuit 100 based on the proximity of the various circuit components of the integrated circuit 100 to one another. The voltage V is defined by the reset level, for example first power supply voltage Vdd_1. Accordingly, because the full well capacity of the photodiode 101 is proportional to the magnitude of first power supply voltage Vdd_1, as the first power supply voltage Vdd_1 increases, the full well capacity increased. But because the integrated circuit 100 includes the level shifter 117 between the first node 119 and the second node 121, second power supply voltage Vdd_2 is less than the voltage level as the first power supply voltage Vdd_1, which makes it possible to increase full well capacity of the photodiode 101 without increasing power consumption of the integrated circuit 100, or at least while limiting the amount of power consumed.

The transfer transistor gate of the transfer transistor 107, the first reset transistor gate of the first reset transistor 109, the second reset transistor gate of the second reset transistor 111, the source follower gate of the source follower transistor 113, and the select transistor gate of the select transistor 115 have gate oxides. The gate oxides of the transistors included in the integrated circuit 100 have corresponding gate oxide thicknesses. In some embodiments, the gate oxide thicknesses of the various transistor gates are the same. In other embodiments, at least the gate oxide thickness of the source follower gate of the source follower transistor 113 is less than one or more of the gate oxide thickness of the transfer transistor gate of the transfer transistor 107 or the gate oxide thickness of the first reset transistor gate of the first reset transistor 109. Because integrated circuit 100 makes it possible to reduce the overall power consumed by the integrated circuit 100, at least the thickness of the source follower gate oxide is capable of being reduced compared to the thicknesses of the gate oxides of the other transistors included in integrated circuit 100. A reduction in overall power consumption, or at least a reduction in the magnitude of power supply voltage supplied to the source follower transistor 113, allows for a reduction in the gate oxide thickness of the source follower transistor 113, which increases transfer conductance Gsf for a given current and transistor size. The reduction in gate oxide thickness of at least the source follower transistor 113 makes it possible to reduce the settling time of the source follower transistor 113, thereby improving device performance.

Figure 2:
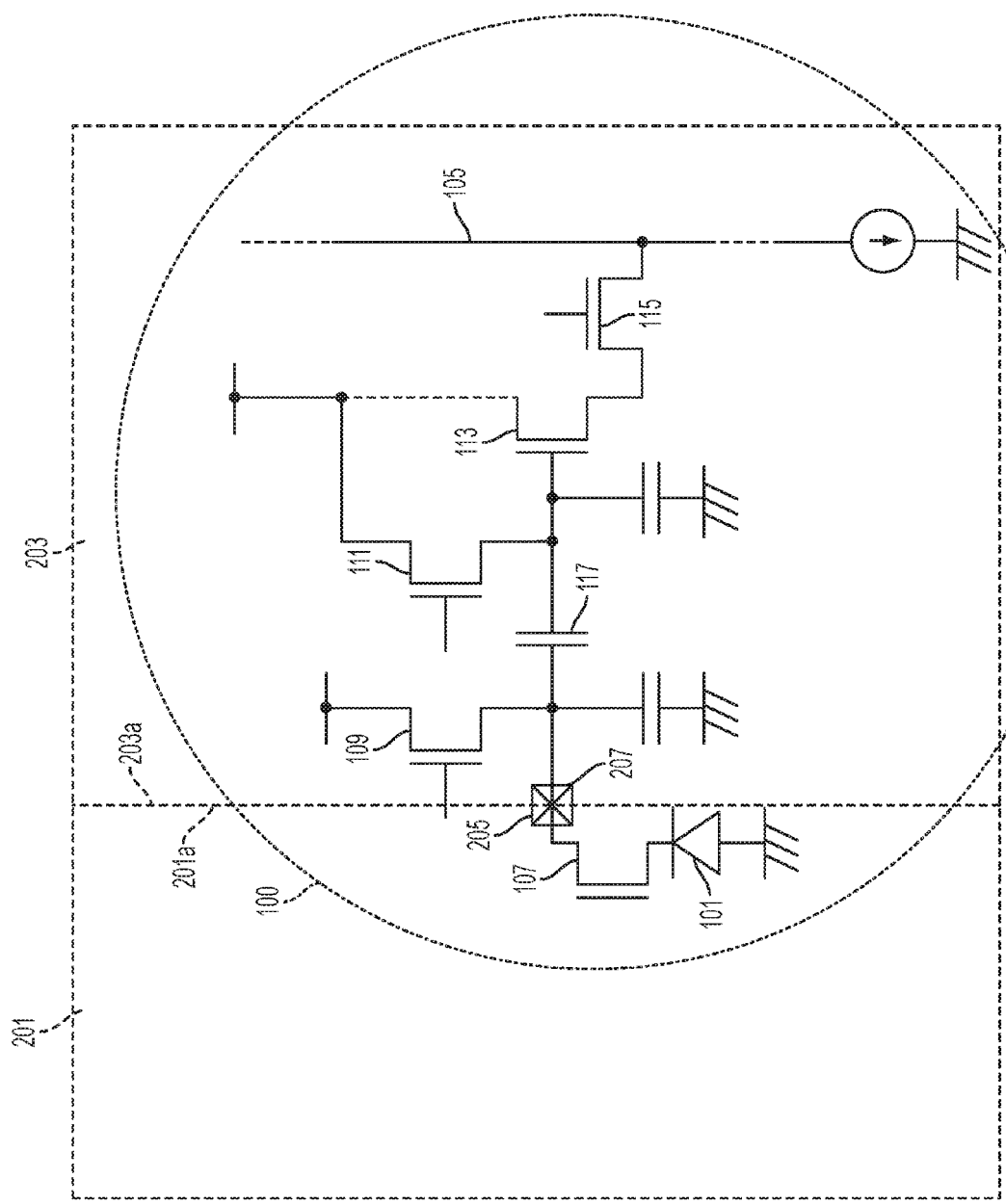
FIG. 2 is a schematic diagram of an integrated circuit, in accordance with one or more embodiments.

FIG. 2 is a schematic diagram of integrated circuit 100, in accordance with one or more embodiments. In some embodiments, the integrated circuit 100 comprises, or is formed on, either a first substrate 201, or the first substrate 201 and a second substrate 203 that is separate from the first substrate 201. The first substrate 201 and/or the second substrate 203 comprise silicon, glass, a polymer, or other suitable material upon which an integrated circuit such as integrated circuit 100 is capably formed.

In some embodiments, the first substrate 201 is over the second substrate 203. In other embodiments, the second substrate 203 is over the first substrate 201. In further embodiments, the first substrate 201 and the second substrate 203 are side-by-side on a same or a different level with respect to one another.

In this embodiment, the photodiode 101 and the transfer transistor 107 are on the first substrate 201. The column line 105, the first reset transistor 109, the second reset transistor 111, the source follower transistor 113, the select transistor 115, and the level shifter 117 are on the second substrate 203. In some embodiments, the integrated circuit 100 includes a first electrode 205 proximate a first edge 201a of the first substrate 201, and a second electrode 207 proximate a second edge 203a of the second substrate 203. The photodiode 101 on the first substrate 201 and the source follower transistor 113 on the second substrate 203 are electrically coupled by way of the first electrode 205 and the second electrode 207.

Figure 3:
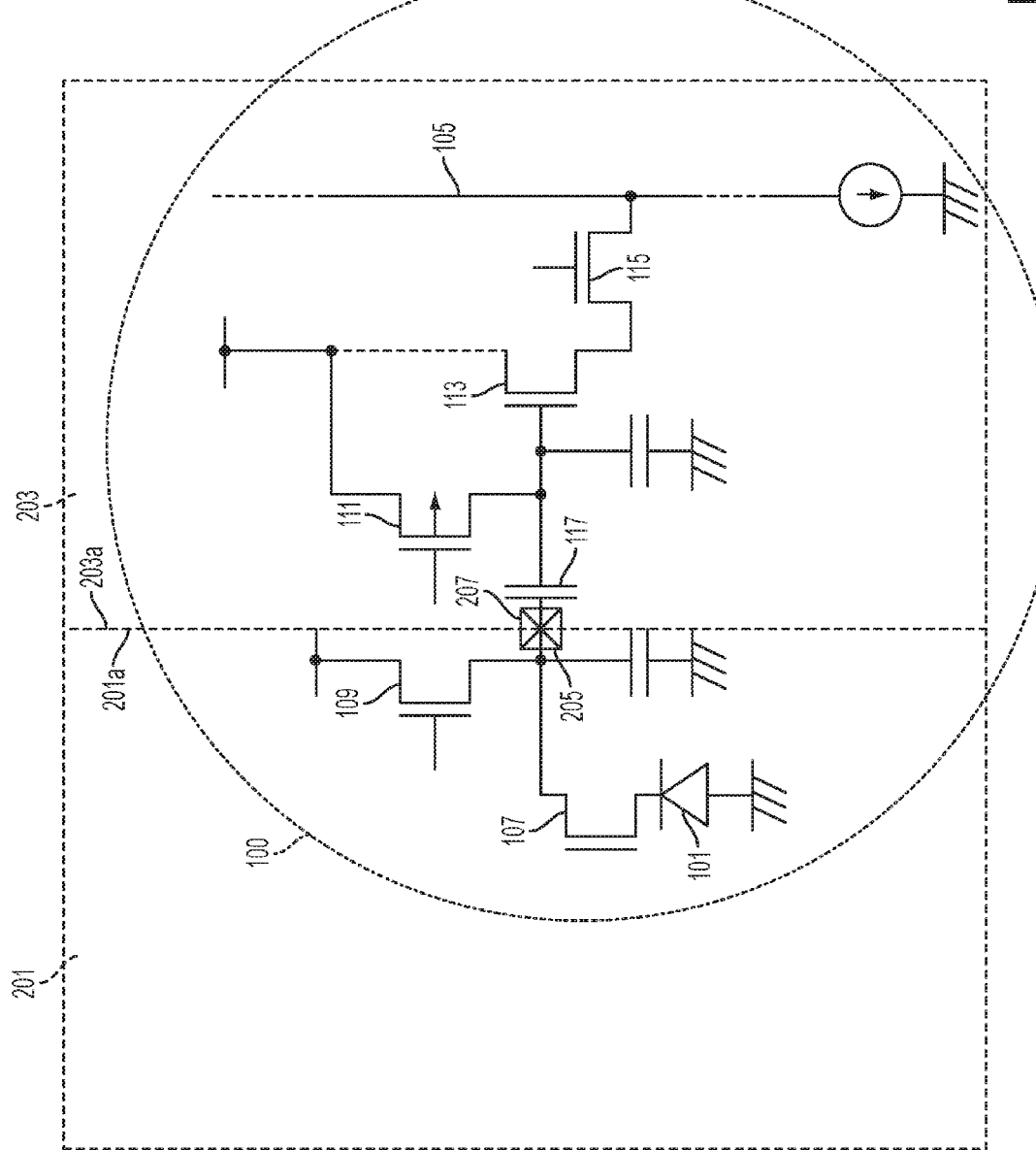
FIG. 3 is a schematic diagram of an integrated circuit, in accordance with one or more embodiments.

FIG. 3 is a schematic diagram of integrated circuit 100, in accordance with one or more embodiments. In this embodiment, photodiode 101, transfer transistor 107, and first reset transistor 109 are on the first substrate 201. The column line 105, second reset transistor 111, the source follower transistor 113, the select transistor 115, and the level shifter 117 are on the second substrate 203. In some embodiments, if the first reset transistor 109 is on the first substrate 201, then the level shifter 117 is optionally on the first substrate 201 instead of the second substrate 203. The first electrode 205 is proximate the first edge 201a of the first substrate 201, and the second electrode 207 is proximate the second edge 203a of the second substrate 203. The photodiode 101 on the first substrate 201 and the source follower transistor 113 on the second substrate 203 are electrically coupled by way of the first electrode 205 and the second electrode 207.

Figure 4:
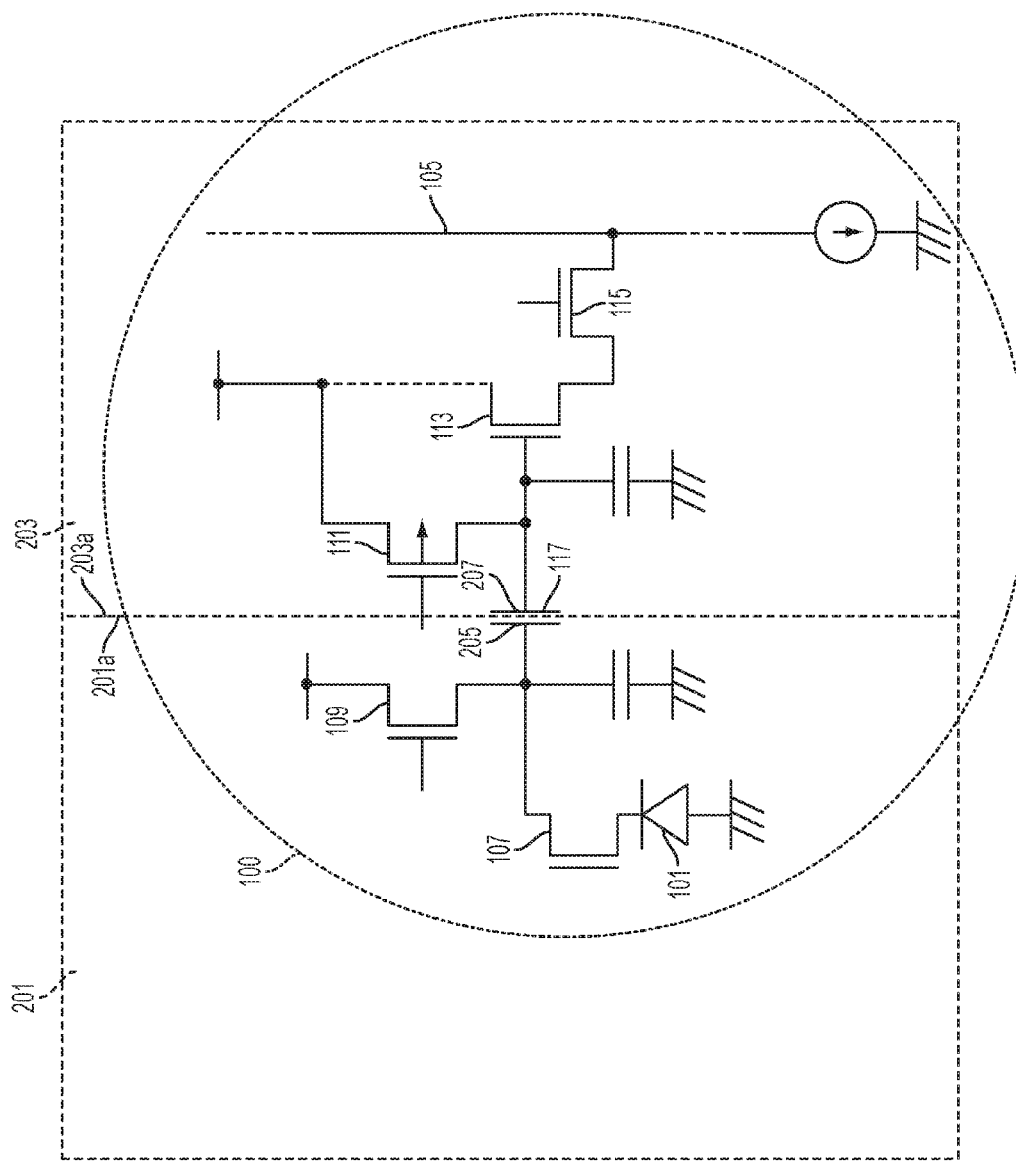
FIG. 4 is a schematic diagram of an integrated circuit, in accordance with one or more embodiments.

FIG. 4 is a schematic diagram of integrated circuit 100, in accordance with one or more embodiments. In this embodiment, photodiode 101, transfer transistor 107, and first reset transistor 109 are on the first substrate 201. The column line 105, second reset transistor 111, the source follower transistor 113, and the select transistor 115 are on the second substrate 203. The first electrode 205 is proximate the first edge 201a of the first substrate 201, and the second electrode 207 is proximate the second edge 203a of the second substrate 203. The photodiode 101 on the first substrate 201 and the source follower transistor 113 on the second substrate 203 are electrically coupled by way of the first electrode 205 and the second electrode 207.

The first electrode 205 and the second electrode 207 are separated by a predetermined distance to form the capacitor of the level shifter 117. A capacitance of the level shifter 117 is based, at least in part, on the distance between the first electrode 205 and the second electrode 207.

Figure 5:
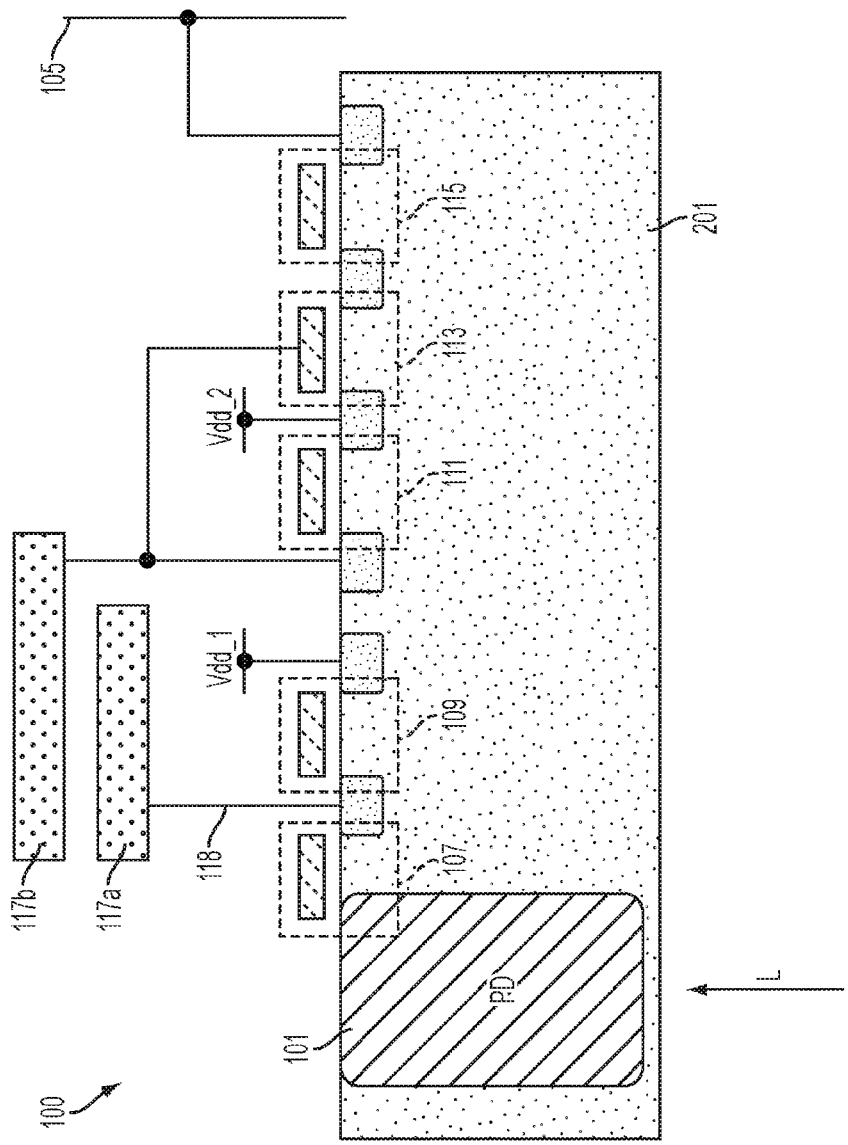
FIG. 5 is a cross-section view of an integrated circuit, in accordance with one or more embodiments.

FIG. 5 is a cross-section view of integrated circuit 100, in accordance with one or more embodiments. In this embodiment, the integrated circuit 100 is on or comprises first substrate 201. Integrated circuit 100, in this example, is a backside illuminated image sensor in which photodiode 101 is exposed to light L from a backside of first substrate 201.

The photodiode 101 is electrically coupled to the column line 105 by way of the electrical connections 118 and the transfer transistor 107, the first reset transistor 109, the second reset transistor 111, the source follower transistor 113, the select transistor 115 and the level shifter 117 (in this example, the level shifter 117 comprises a metal-oxidemetal capacitor having a first metal line 117a and a second metal line 117b). In some embodiments, the first metal line 117a and the second metal line 117b are distanced from the first substrate 201 to minimize a parasitic capacitance that could exist between the level shifter 117 and the other circuit elements of integrated circuit 100.

Figure 6:
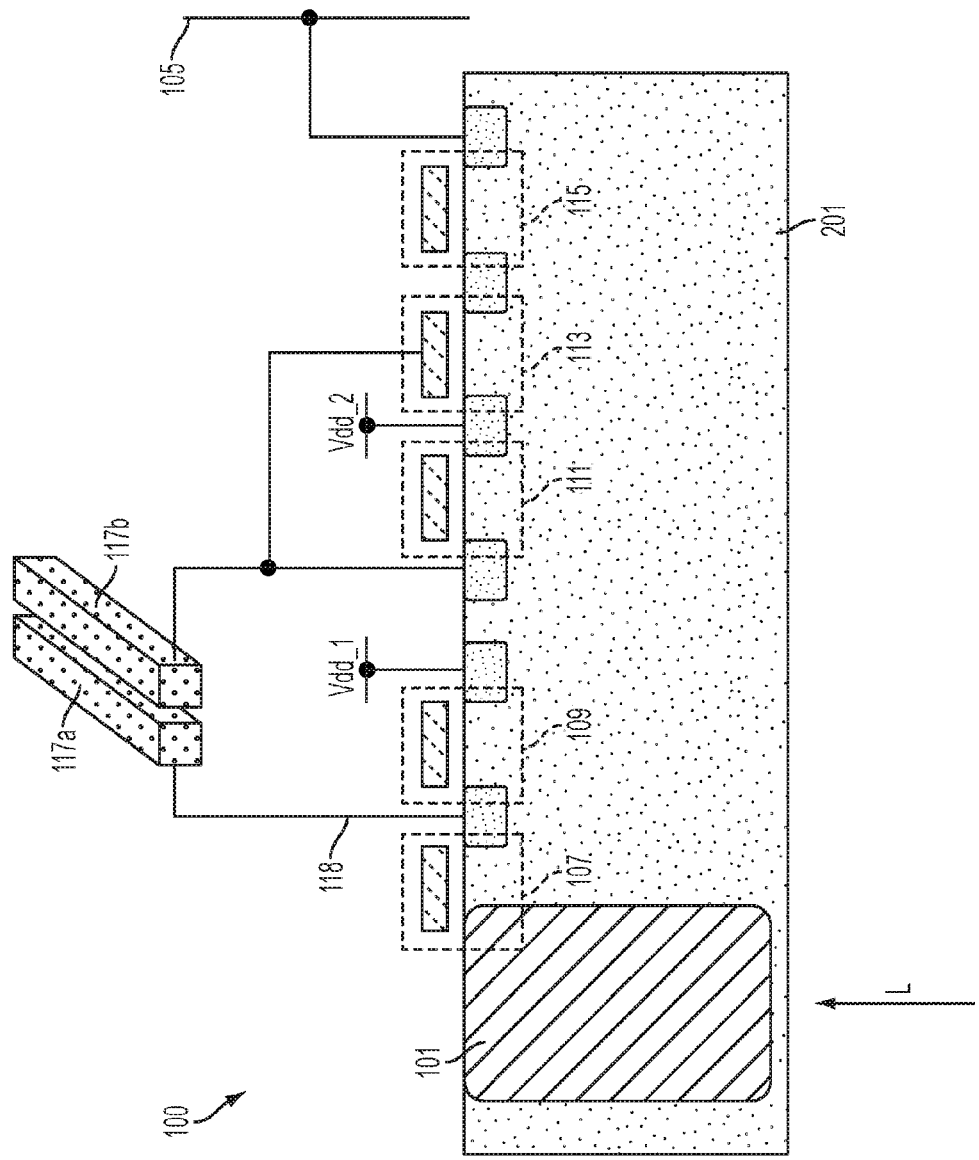
FIG. 6 is a cross-section view of an integrated circuit, in accordance with one or more embodiments.

FIG. 6 is a cross-section view of integrated circuit 100, in accordance with one or more embodiments. In this embodiment, the integrated circuit 100 is on or comprises first substrate 201. Integrated circuit 100, in this example, is a backside illuminated image sensor in which photodiode 101 is exposed to light L from a backside of first substrate 201.

The photodiode 101 is electrically coupled to the column line 105 by way of the electrical connections 118 and the transfer transistor 107, the first reset transistor 109, the second reset transistor 111, the source follower transistor 113, the select transistor 115 and the level shifter 117 (in this example, the level shifter 117 comprises a metal-insulator-metal capacitor having the first metal line 117a and the second metal line 117b). In some embodiments, the first metal line 117a and the second metal line 117b are distanced from the first substrate 201 to minimize a parasitic capacitance that could exist between the level shifter 117 and the other circuit elements of integrated circuit 100.

Figure 7:
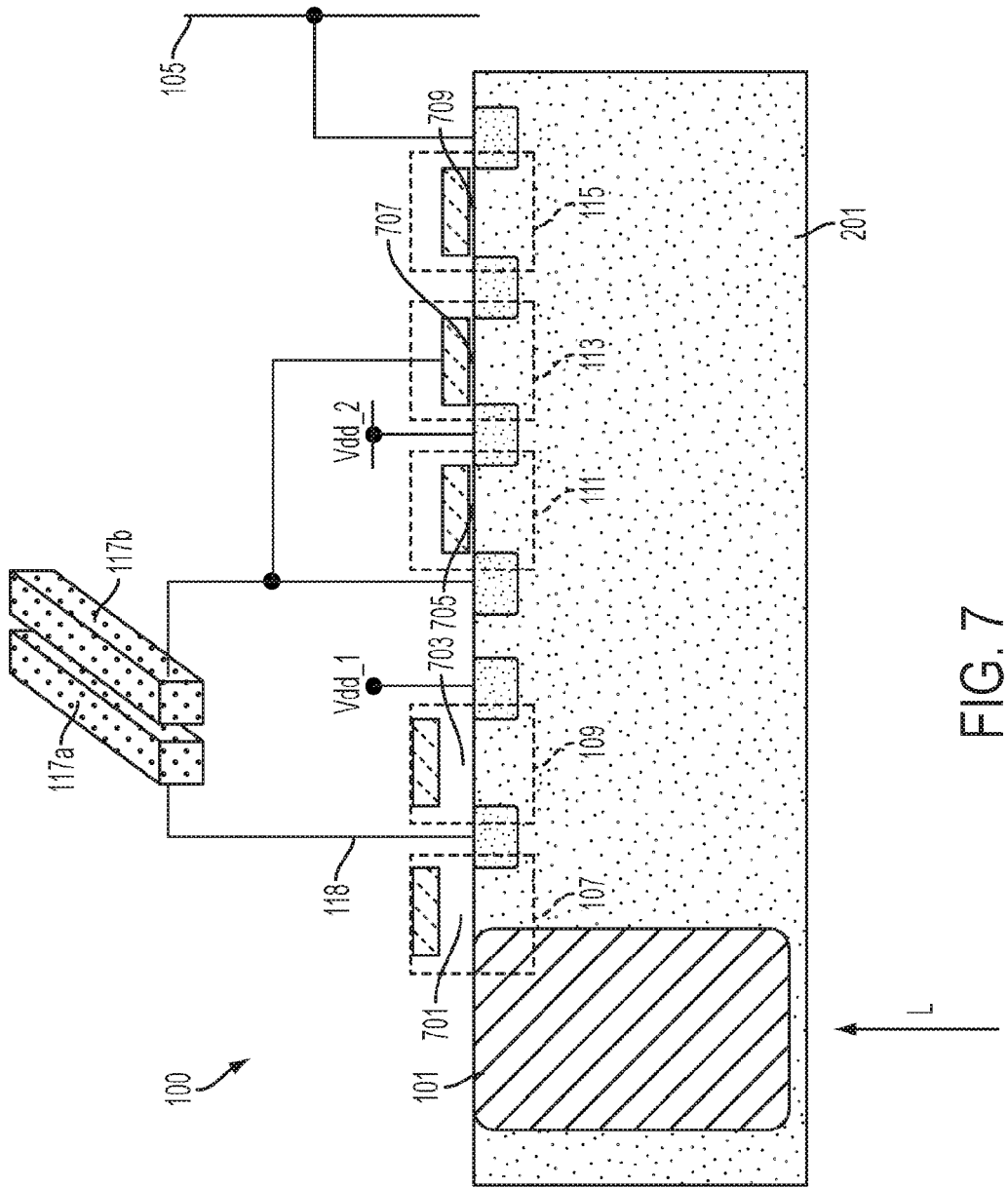
FIG. 7 is a cross-section view of an integrated circuit, in accordance with one or more embodiments.

FIG. 7 is a cross-section view of integrated circuit 100, in accordance with one or more embodiments. In this embodiment, the integrated circuit 100 is on or comprises first substrate 201. Integrated circuit 100, in this example, is a backside illuminated image sensor in which photodiode 101 is exposed to light L from a backside of first substrate 201.

The photodiode 101 is electrically coupled to the column line 105 by way of the electrical connections 118 and the transfer transistor 107, the first reset transistor 109, the second reset transistor 111, the source follower transistor 113, the select transistor 115 and the level shifter 117 (in this example, the level shifter 117 comprises a metal-insulator-metal capacitor having the first metal line 117a and the second metal line 117b). In some embodiments, the first metal line 117a and the second metal line 117b are distanced from the first substrate 201 to minimize a parasitic capacitance that could exist between the level shifter 117 and the other circuit elements of integrated circuit 100.

The transfer transistor 107 has a transistor gate oxide 701, the first reset transistor 109 has a first reset transistor gate oxide 703, the second reset transistor 111 has a second reset transistor gate oxide 705, the source follower transistor 113 has a source follower gate oxide 707, and the select transistor 115 has a select transistor gate oxide 709 (collectively referred to as gate oxides 701-709). Though not limited to the embodiment illustrated in FIG. 7, because the integrated circuit 100 makes it possible to reduce the overall power consumption of the integrated circuit 100 by providing level shifter 117 that makes it possible to supply a lesser supply power voltage to the source follower transistor 113, at least the thickness of the source follower gate oxide 707 is capable of being reduced compared to the thicknesses of the gate oxides 701-705 and 709 of the other transistors of the integrated circuit 100. In this embodiment, the gate oxide thicknesses of gate oxides 705, 707 and 709 is less than the gate oxide thicknesses of gate oxides 701 and 703. In other embodiments, a different combination of gate oxide thicknesses is possible. For example, some of the gate oxide thicknesses 701-709 are the same while other gate oxide thicknesses 701-709 are different. In some embodiments, the gate oxide thicknesses 701-709 are the same, however.

Figure 8:
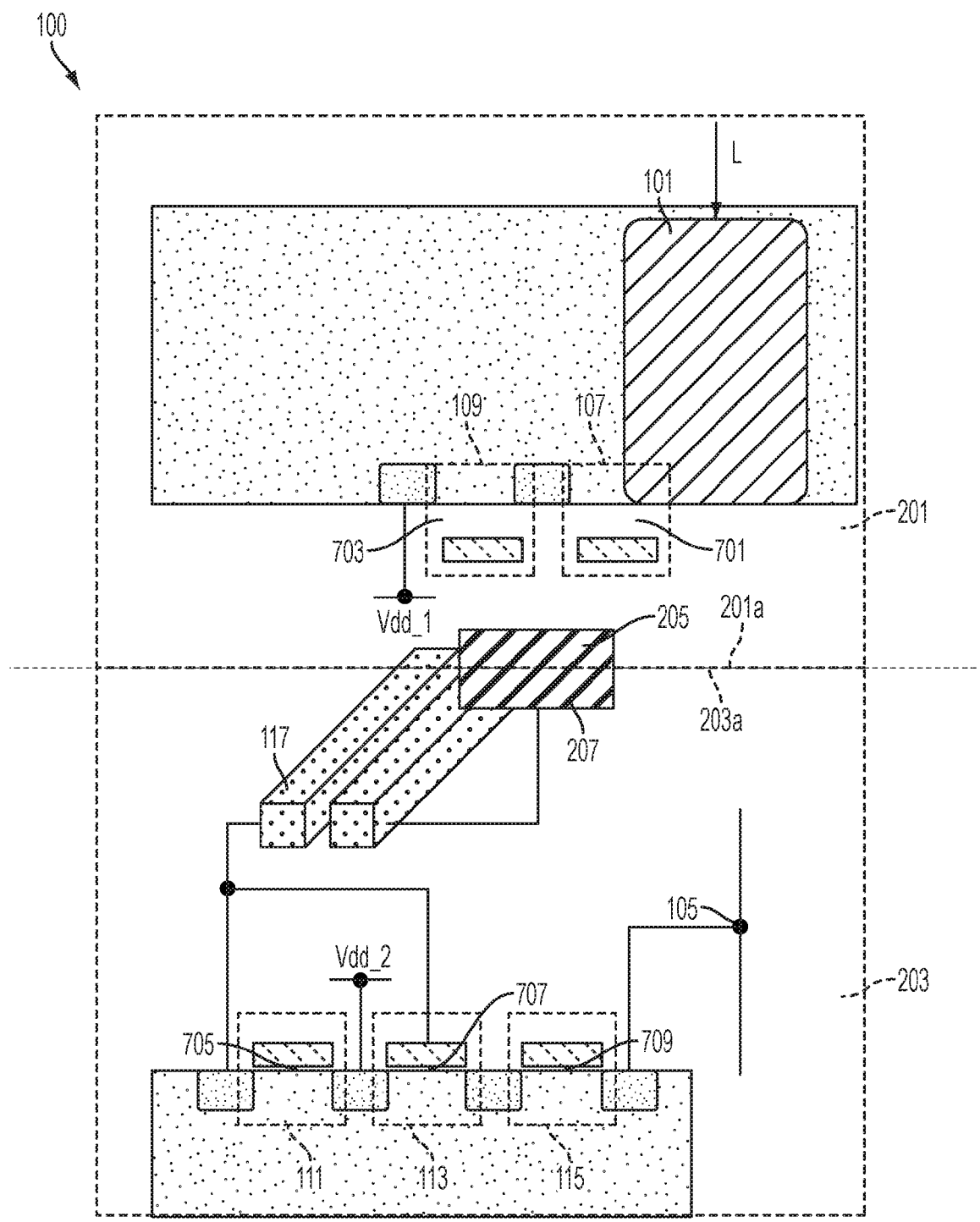
FIG. 8 is a cross-section view of an integrated circuit, in accordance with one or more embodiments.

FIG. 8 is a cross-section view of integrated circuit 100, in accordance with one or more embodiments. In this embodiment, the integrated circuit 100 comprises, or is formed on, the first substrate 201 and the second substrate 203. The first substrate 201 is over the second substrate 203, making the integrated circuit 100 a top side illuminated image sensor. In other embodiments, the second substrate 203 is over the first substrate 201 making the integrated circuit 100 a back-side illuminated image sensor.

In this embodiment, photodiode 101, transfer transistor 107, and first reset transistor 109 are on the first substrate 201. The column line 105, second reset transistor 111, the source follower transistor 113, the select transistor 115, and the level shifter 117 are on the second substrate 203. In some embodiments, if the first reset transistor 109 is on the first substrate 201, then the level shifter is optionally on the first substrate 201 instead of the second substrate 203. The first electrode 205 is proximate the first edge 201a of the first substrate 201, and the second electrode 207 is proximate the second edge 203a of the second substrate 203. The photodiode 101 on the first substrate 201 and the source follower transistor 113 on the second substrate 203 are electrically coupled by way of the first electrode 205 and the second electrode 207. Gate oxides 705-709 have thicknesses that are less than gate oxides 701 and 703. In some embodiments, the gate oxide thicknesses 701-709 are the same, however.

Figure 9:
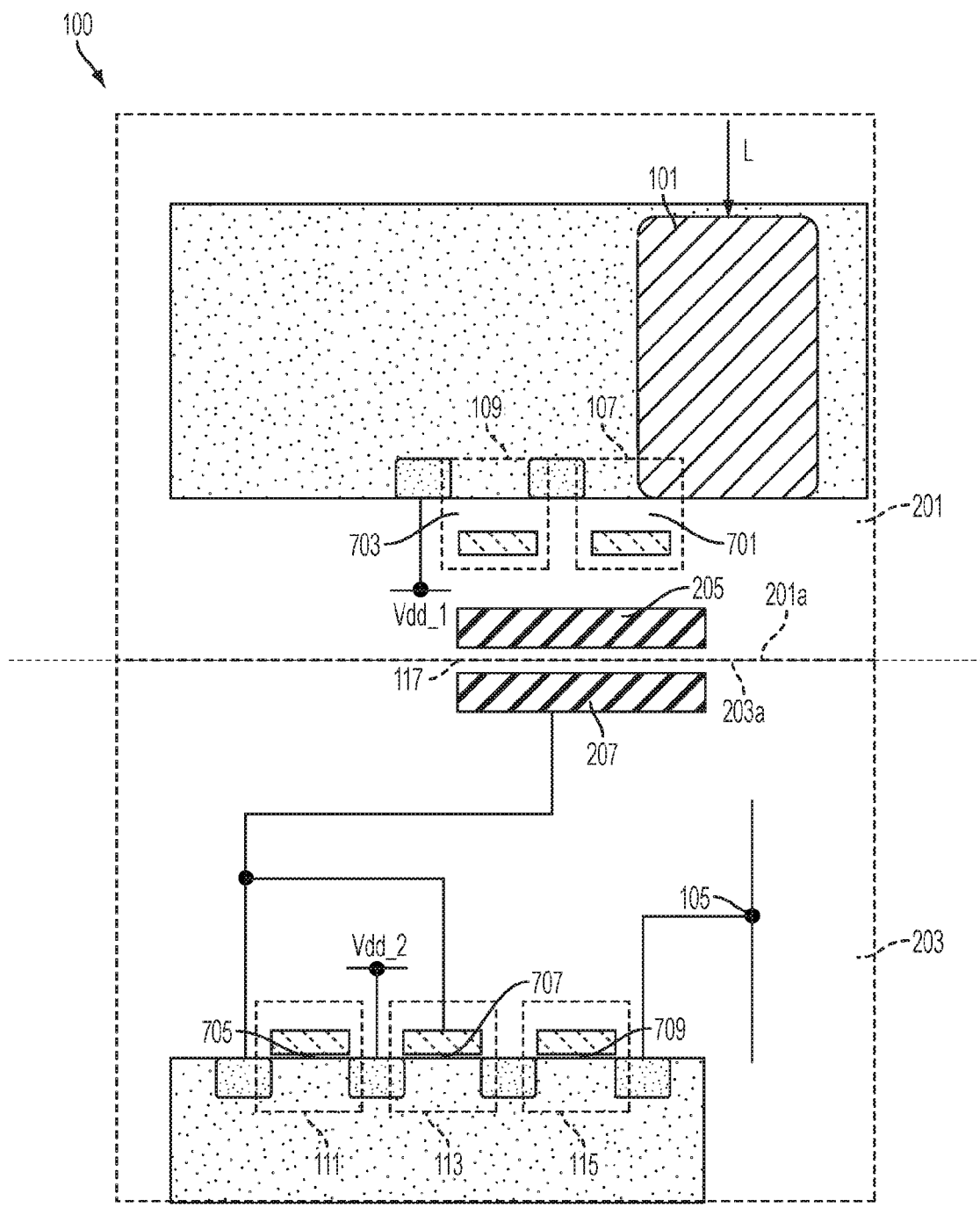
FIG. 9 is a cross-section view of an integrated circuit, in accordance with one or more embodiments.

FIG. 9 is a cross-section view of integrated circuit 100, in accordance with one or more embodiments. In this embodiment, the integrated circuit 100 comprises, or is formed on, the first substrate 201 and the second substrate 203. The first substrate 201 is over the second substrate 203, making the integrated circuit 100 a top side illuminated image sensor. In other embodiments, the second substrate 203 is over the first substrate 201 making the integrated circuit 100 a back-side illuminated image sensor.

In this embodiment, photodiode 101, transfer transistor 107, and first reset transistor 109 are on the first substrate 201. The column line 105, second reset transistor 111, the source follower transistor 113, and the select transistor 115 are on the second substrate 203. The first electrode 205 is proximate the first edge 201a of the first substrate 201, and the second electrode 207 is proximate the second edge 203a of the second substrate 203. The photodiode 101 on the first substrate 201 and the source follower transistor 113 on the second substrate 203 are electrically coupled by way of the first electrode 205 and the second electrode 207. Gate oxides 705-709 have thicknesses that are less than gate oxides 701 and 703. In some embodiments, the gate oxide thicknesses 701-709 are the same, however.

The first electrode 205 and the second electrode 207 are separated by a predetermined distance to form the capacitor of the level shifter 117. A capacitance of the level shifter 117 is based, at least in part, on the distance between the first electrode 205 and the second electrode 207.

Figure 10:
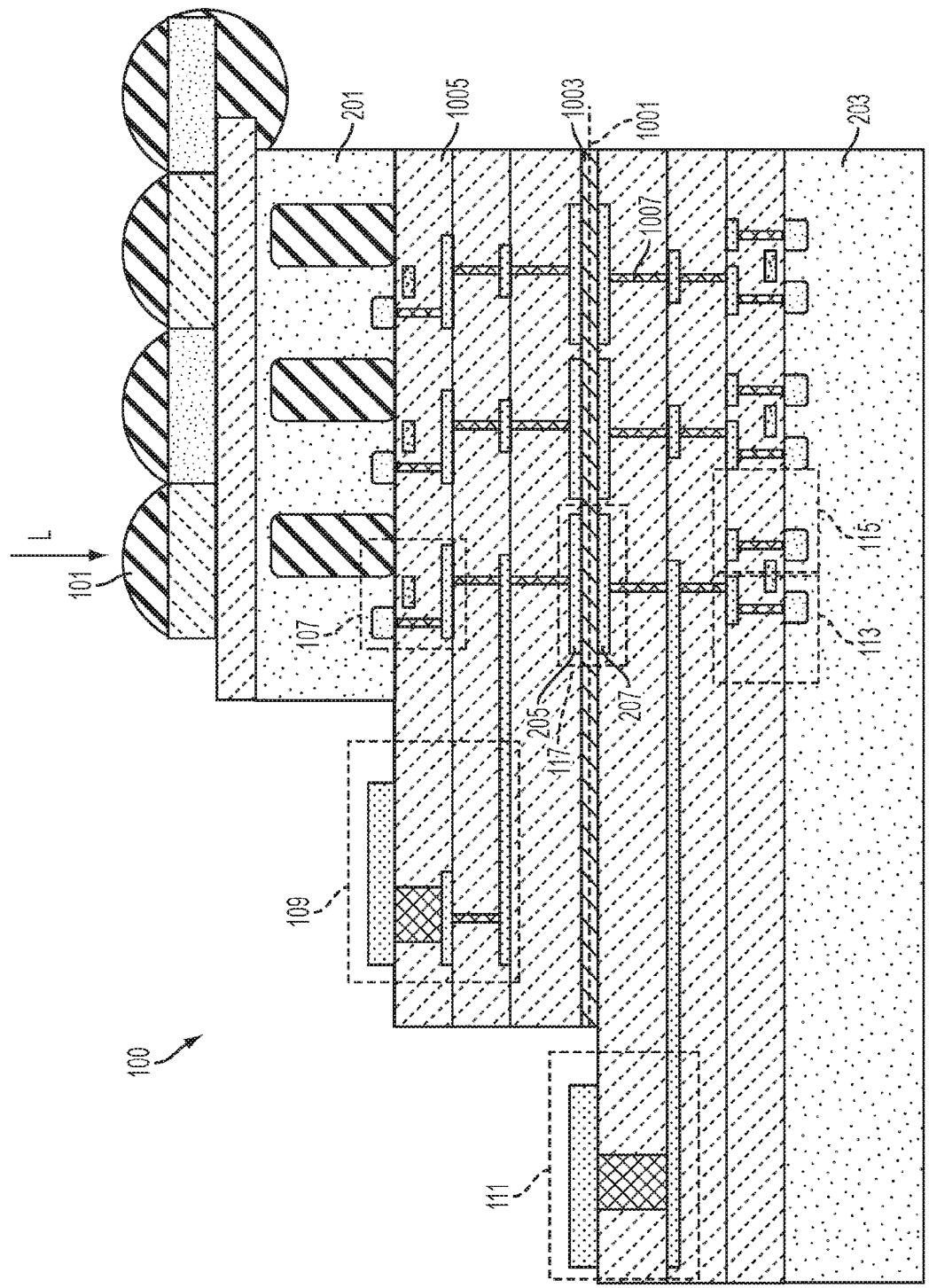
FIG. 10 is a cross-section view of an integrated circuit, in accordance with one or more embodiments.

FIG. 10 is a cross-section view of integrated circuit 100, in accordance with one or more embodiments. In this embodiment, the integrated circuit 100 comprises, or is formed on, the first substrate 201 and the second substrate 203. The first substrate 201 is over the second substrate 203, making the integrated circuit 100 a top side illuminated image sensor. In other embodiments, the second substrate 203 is over the first substrate 201 making the integrated circuit 100 a back-side illuminated image sensor.

In this embodiment, photodiode 101, transfer transistor 107, and first reset transistor 109 are on the first substrate 201. The column line 105, second reset transistor 111, source follower transistor 113, and the select transistor 115 are on the second substrate 203. The first electrode 205 is proximate the first edge 201a of the first substrate 201, and the second electrode 207 is proximate the second edge 203a of the second substrate 203. The photodiode 101 on the first substrate 201 and the source follower transistor 113 on the second substrate 203 are electrically coupled by way of the first electrode 205 and the second electrode 207.

The first electrode 205 and the second electrode 207 are separated by a predetermined distance to form the capacitor of the level shifter 117 at a bonding boundary 1001 between the first substrate 201 and the second substrate 203. A capacitance of the level shifter 117 is based, at least in part, on the distance between the first electrode 205 and the second electrode 207. In some embodiments, the first substrate 201 is bonded to the second substrate 203 by a bonding agent 1003. In some embodiments, the bonding agent 1003 is one or more of an adhesive film, an epoxy, a polymer resin, or other suitable adhesive capable of bonding the first substrate 201 and the second substrate 203 together. In some embodiments, a first portion of the integrated circuit 100 is formed on first substrate 201 and a second portion of the integrated circuit 100 is formed on second substrate 203. The first portion of the integrated circuit 100 is either flipped and bonded to the second portion of the integrated circuit 100 or the second portion of the integrated circuit 100 is flipped and bonded to the first portion of the integrated circuit 100.

In some embodiments, integrated circuit 100 comprises one or more inter-layer dielectric layers 1005 that comprise a silicon dioxide such as undoped silica glass (USG), silicon nitride, silicon oxynitride, polyimide, spin-on glass (SOG), fluoride-doped silicate glass (FSG), carbon doped silicon oxide such as SiCOH, BLACK DIAMOND® (Applied Materials of Santa Clara, Calif.), XEROGEL®, AEROGEL®, amorphous fluorinated carbon, Parylene, BCB (bis-benzocyclobutenes), SILK® (Dow Chemical, Midland, Mich.), and/or other suitable materials. The inter-layer dielectric layers 1005 are formed by suitable technique such as spin-on, CVD, sputtering, or other suitable processes. In some embodiments, plasma enhanced (PE) CVD is used to form silicon oxide from silane (SiH4) or tetraethoxysilane (TEOS). In other embodiments, a high-density plasma (HDP) CVD is used.

The series of electrical connections 118 (FIG. 1) that electrically couple the circuit elements of the integrated circuit 100 comprise various interconnection structures 1007. The inter-layer dielectric layers 1005 and the interconnection structures 1007 are formed, for example, using a damascene process, such as a dual damascene process or a single damascene process. The interconnection structures 1007 are coupled to the photodiode 101 and other circuit elements of the integrated circuit 100. The interconnection structures 1007 comprise various metal features, and contact features configured between metal layers and the first substrate 201. The interconnection structures 1007 further include vias between adjacent metal layers that couple the adjacent metal layers to one another. The interconnection structures 1007 comprise one or more of copper, a copper alloy, titanium, titanium nitride, tantalum, tantalum nitride, tungsten, polysilicon, metal silicide, or another suitable material. Metal silicide includes, for example, nickel silicide, cobalt silicide, tungsten silicide, tantalum silicide, titanium silicide, platinum silicide, erbium silicide, palladium silicide, another suitable material, or combinations thereof. In some embodiments, the interconnection structures 1007 includes multiple-layer structures, such as a barrier layer, a copper seed layer, and bulk copper. In some embodiments, a top metal layer includes aluminum and remaining metal layers include copper. The interconnection structures 1007 are formed by a technique such as chemical vapor deposition, physical vapor deposition (PVD or sputtering), plating, other suitable processes, or combinations thereof. In some embodiments, a PVD process is used to form a copper seed layer, and a plating process is used to deposit bulk copper for metal interconnections.

In some embodiments, the level shifter 117 is a MIM capacitor that includes the first electrode 205, the second electrode 207, and the bonding agent 1003. In some embodiments, the first electrode 205 and the second electrode 207 are conductive and comprise a conductive material such as TiN, TaN, ruthenium, aluminum, tungsten, copper, or other conductive material. The first electrode 205 and the second electrode 207 are formed using, for example, a PVD, an ECP, or a CVD process. In some embodiments, in addition to, or as an alternative to the bonding agent 1003, the MIM capacitor includes an oxide-containing film, a high-dielectric constant film, a nitride film, a BPSG film, a TEOS layer, or other dielectric or insulating material to provide the spacing between the first electrode 205 and the second electrode 207 to form the MIM capacitor. The bonding agent 1003 or the other material between the first electrode 205 and the second electrode 207 is applied using one or more of an electric furnace, a CVD method, or a PVD method.

Figure 11:
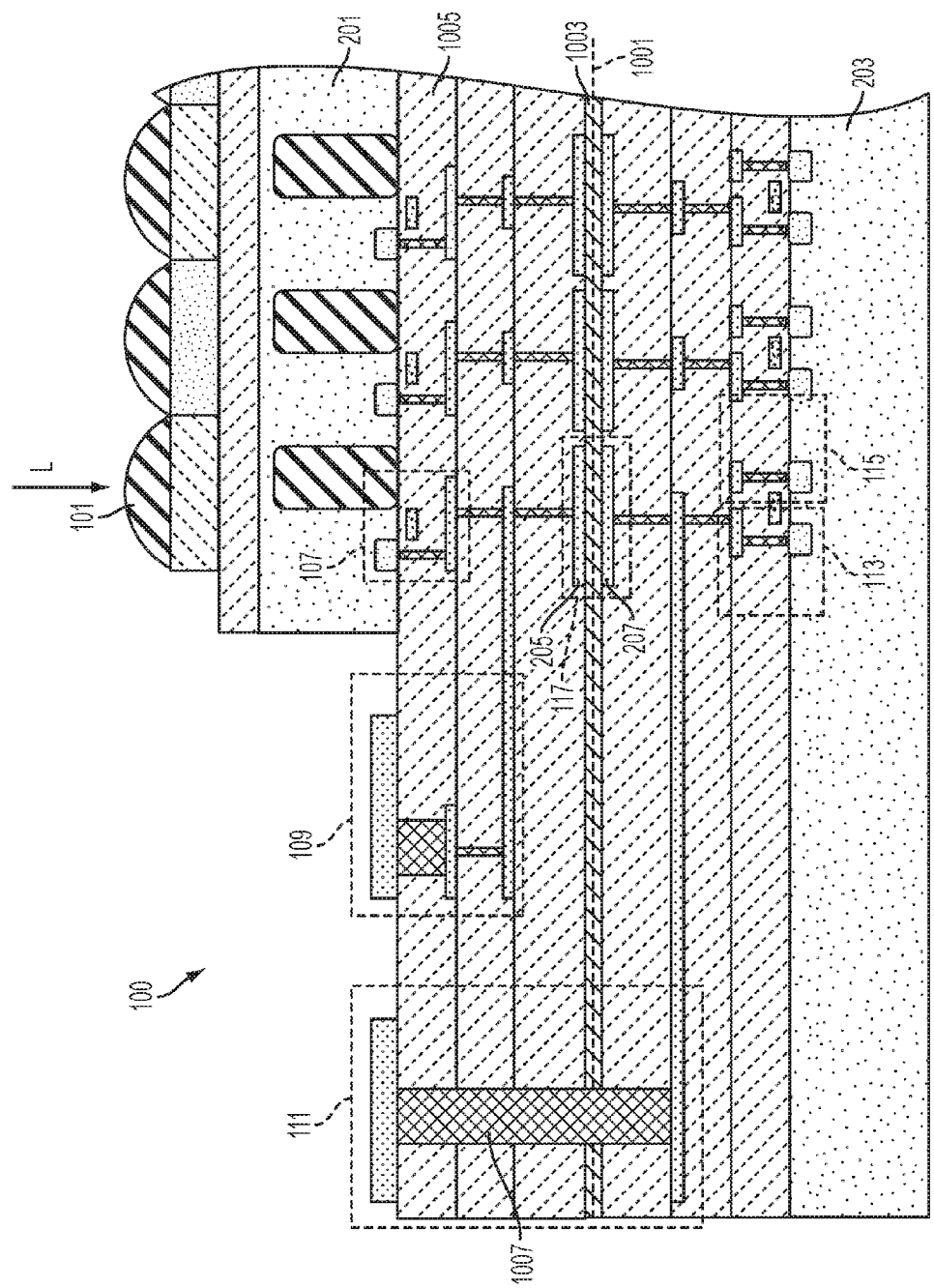
FIG. 11 is a cross-section view an integrated circuit, in accordance with one or more embodiments.

FIG. 11 is a cross-section view of integrated circuit 100, in accordance with one or more embodiments. In this embodiment, the first reset transistor 109 is on the first substrate 201 and the second reset transistor 111 is partially on the first substrate 201 and partially on the second substrate 203 such that the portion of the second reset transistor 111 on the first substrate 201 is directly coupled to the portion of the second reset transistor 111 on the second substrate 203 by an interconnection structure 1007.

Figure 12:
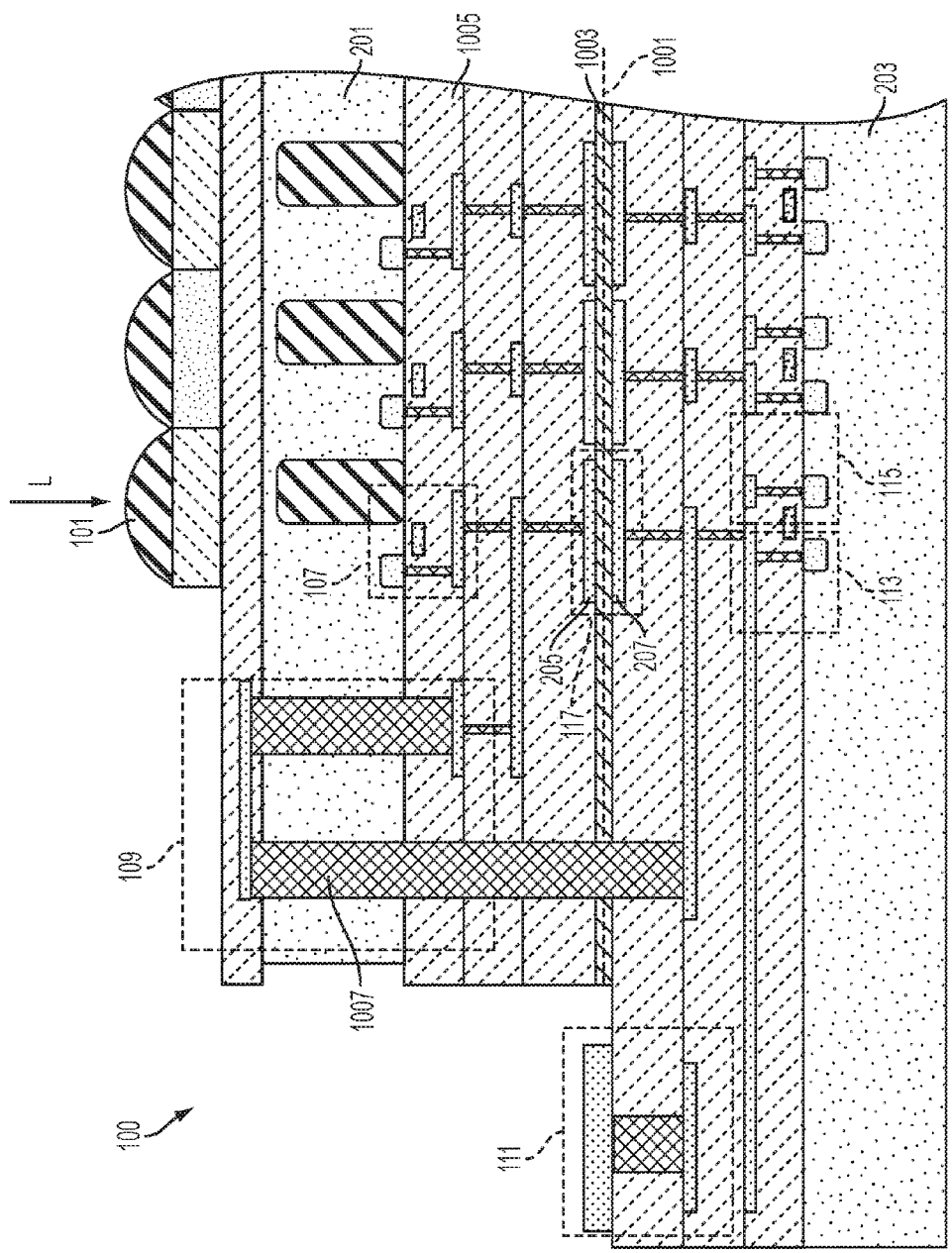
FIG. 12 is a cross-section view an integrated circuit, in accordance with one or more embodiments.

FIG. 12 is a cross-section view of integrated circuit 100, in accordance with one or more embodiments. In this embodiment, the first reset transistor 109 is partially on the first substrate 201 and partially on the second substrate. The second reset transistor 111 is on the second substrate 203. The portion of the first reset transistor 109 on the first substrate 201 is directly coupled to the portion of the first reset transistor 109 on the second substrate 203 by an interconnection structure 1007. The first reset transistor 109, in this example, is electrically coupled to the level shifter 117 on a first substrate 201 side of the level shifter 117 and on a second substrate 203 side of the level shifter 117.

Figure 13:
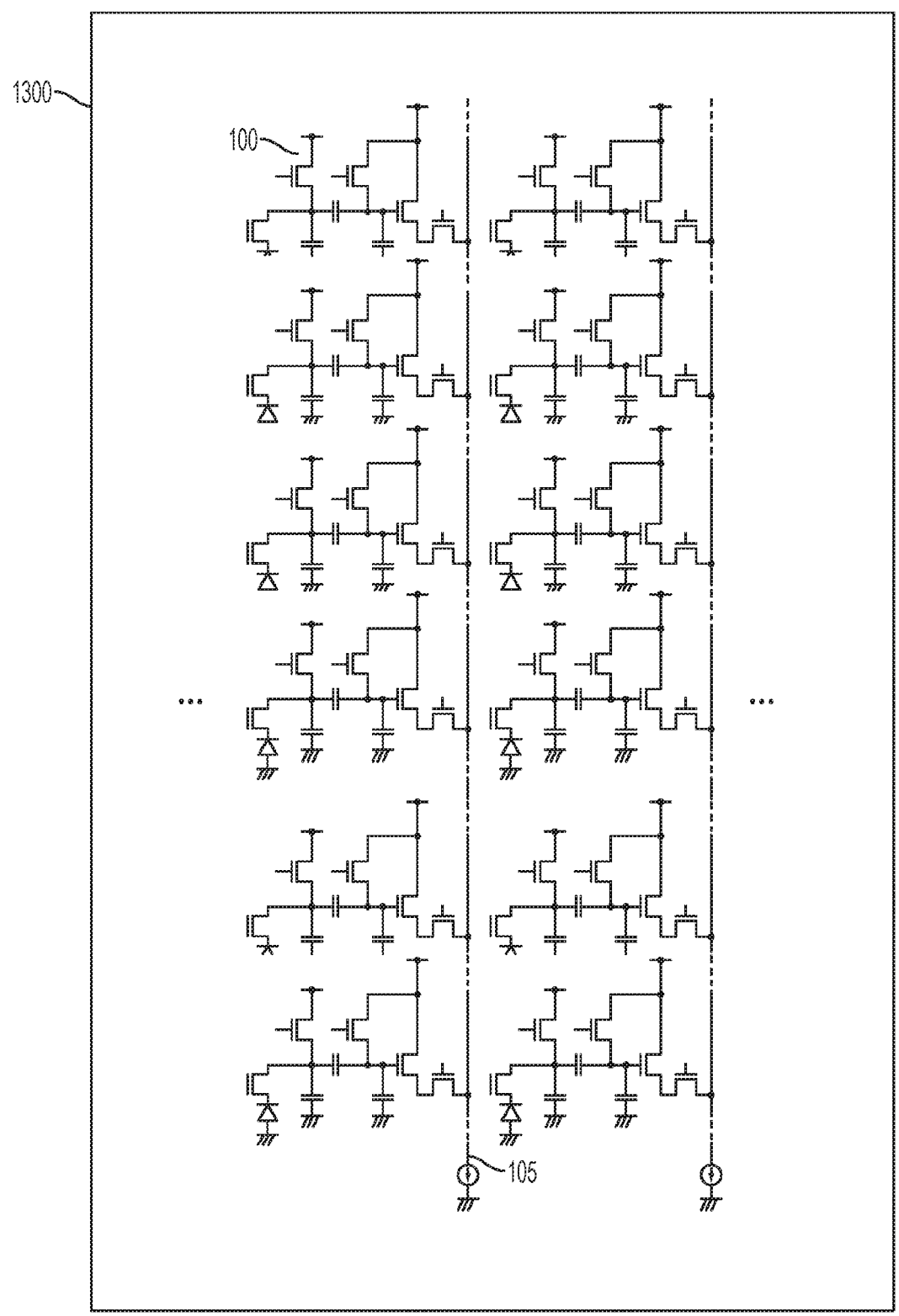
FIG. 13 is a diagram of an array of integrated circuits, in accordance with one or more embodiments.

FIG. 13 is a diagram of an array of integrated circuits 1300, in accordance with one or more embodiments. The array of integrated circuits 1300 includes more than one integrated circuit 100 coupled to the column line 105. The array of integrated circuits 1300 is a two-dimensional array (2-D array) that is capable of including multiple column lines 105 to which one or more integrated circuits 100 are coupled. In some embodiments, the array of integrated circuit 1300 is formed over a single substrate 201 (FIG. 2), two substrates such as substrate 201 and 203 (FIG. 2), or a different number of substrates that are combined, joined or couple. For example, more than two substrates are optionally included in the array of integrated circuits 1300 if the individual integrated circuits 100 are individually formed over respective substrates 201 and 203, and the integrated circuits 100 and respective column lines are joined or coupled with one another.

Figure 14:
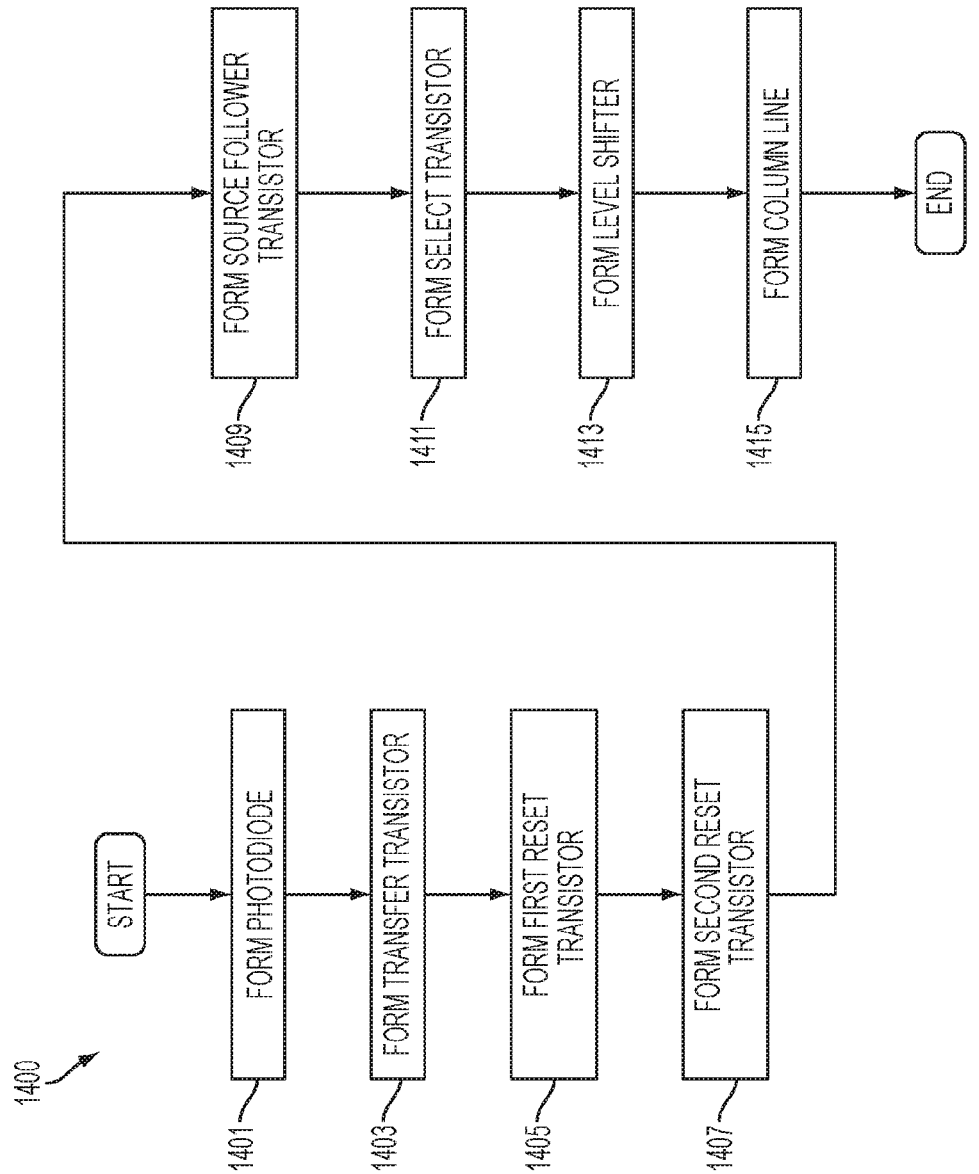
FIG. 14 is a method of forming an integrated circuit, in accordance with one or more embodiments.

FIG. 14 is a flowchart of a method 1400 of forming integrated circuit 100, in accordance with one or more embodiments. Method 1400 begins with step 1401 in which photodiode 101 (FIG. 1) is formed on first substrate 201 (FIG. 2). In step 1403, transfer transistor 107 (FIG. 1) is formed on the first substrate 201. In step 1405, first reset transistor 109 (FIG. 1) is formed on the first substrate 201. In step 1407, second reset transistor 111 (FIG. 1) is formed on the first substrate 201 or the second substrate 203 (FIG. 2). In step 1409, the source follower transistor 113 is formed on the first substrate 201 or the second substrate 203. In step 1411, the select transistor 115 is formed on the first substrate 201 or the second substrate 203. In step 1413, column line 105 (FIG. 1) is formed on the first substrate 201 or the second substrate 203. In step 1415, level shifter 117 (FIG. 1) is formed on the first substrate 201 or the second substrate 203. The level shifter 117 is electrically coupled to the photodiode 101, the transfer transistor 107, the first reset transistor 109, the second reset transistor 111, the source follower transistor 113, the select transistor 115, and the column line 105 between the first reset transistor 109 and the second reset transistor 111 by, for example, either direct interconnection between the various circuit elements of the integrated circuit 100, or indirect interconnection such as by way of one or more electrical connections 118 that are formed to couple the various circuit elements of the integrated circuit 100. In some embodiments, the forming is on two or more substrates are described herein. In some embodiments, the two or more substrates are optionally bonded as described herein.

In some embodiments, a circuit comprises a photodiode electrically coupled to a first node, the first node configured to be charged by a first power supply voltage, a second node, the second node configured to be charged by a second power supply voltage lower than the first power supply voltage, a source follower transistor electrically coupled between the second node and a column line, and a level shifter electrically coupled between the first node and the second node.

In some embodiments, a circuit comprises a first node on a first substrate, the first node configured to be charged by a first power supply voltage, a second node on a second substrate, the second node configured to be charged by a second power supply voltage lower than the first power supply voltage, a photodiode on the first substrate and electrically coupled to the first node, a source follower transistor on the second substrate and electrically coupled between the second node and a column line, and a level shifter electrically coupled between the first node and the second node.

In some embodiments, a method comprises charging a photodiode and a first node to a first power supply voltage, charging a second node to have a second node voltage equal to a second power supply voltage, the second power supply voltage being lower than the first power supply voltage, the second node being electrically coupled to the first node by a level shifter. The method further comprises electrically connecting the photodiode to the first node and outputting a voltage with a source follower transistor electrically coupled to a column line, the voltage being based on the second node voltage and indicative of exposure of the photodiode to light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a photodiode electrically coupled to a first node, the first node configured to be charged by a first power supply voltage;
a second node, the second node configured to be charged by a second power supply voltage lower than the first power supply voltage;
a source follower transistor electrically coupled between the second node and a column line; and
a level shifter electrically coupled between the first node and the second node.

2. The circuit of claim 1, wherein the level shifter comprises a capacitor.

3. The circuit of claim 2, wherein a signal level at the second node is based on
a number of signal electrons at the photodiode,
a level shifter capacitance of the capacitor,
a first node capacitance of the first node, and
a second node capacitance of the second node.

4. The circuit of claim 1, wherein
the photodiode is electrically coupled to the first node by a transfer transistor, the transfer transistor comprising a first gate having a first oxide thickness, and
the source follower transistor comprises a second gate having a second oxide thickness less than the first oxide thickness.

5. The circuit of claim 1, wherein the circuit is one circuit of a plurality of circuits of a pixel array, each circuit of the plurality of circuits being electrically coupled to the column line.

6. The circuit of claim 5, wherein
the column line is one column line of a plurality of column lines of the pixel array, and
the plurality of circuits is one plurality of circuits of multiple pluralities of circuits, each circuit of a given plurality of circuits being electrically coupled to a column line of the plurality of column lines corresponding to the given plurality of circuits.

7. A circuit comprising:
a first node on a first substrate, the first node configured to be charged by a first power supply voltage;
a second node on a second substrate, the second node configured to be charged by a second power supply voltage lower than the first power supply voltage;
a photodiode on the first substrate and electrically coupled to the first node;
a source follower transistor on the second substrate and electrically coupled between the second node and a column line; and
a level shifter electrically coupled between the first node and the second node.

8. The circuit of claim 7, wherein
the first substrate is bonded to the second substrate at a bonding boundary, and
the level shifter comprises a capacitor, the capacitor comprising:
a first electrode on the first substrate at the bonding boundary, and
a second electrode on the second substrate at the bonding boundary.

9. The circuit of claim 8, wherein a signal level at the second node is based on
- a number of signal electrons at the photodiode,
- a level shifter capacitance of the capacitor,
- a first node capacitance of the first node, and
- a second node capacitance of the second node.

10. The circuit of claim 7, wherein
- the circuit is one circuit of a plurality of circuits of a pixel array,
- each circuit of the plurality of circuits comprises a photodiode on the first substrate, and
- each circuit of the plurality of circuits is electrically coupled to the column line.

11. A method comprising:
- charging a photodiode and a first node to a first power supply voltage;
- charging a second node to have a second node voltage equal to a second power supply voltage, the second power supply voltage being lower than the first power supply voltage, the second node being electrically coupled to the first node by a level shifter;
- electrically connecting the photodiode to the first node; and
- outputting a voltage with a source follower transistor electrically coupled to a column line, the voltage being based on the second node voltage and indicative of exposure of the photodiode to light.

12. The method of claim 11, wherein the level shifter comprises a capacitor.

13. The method of claim 12, wherein outputting the voltage comprises outputting the voltage based on
- a number of signal electrons at the photodiode,
- a level shifter capacitance of the capacitor,
- a first node capacitance of the first node, and
- a second node capacitance of the second node.

14. The method of claim 11, wherein charging the photodiode and the first node to the first power supply voltage comprises using a signal having the first power supply voltage to control a first transistor electrically coupled to the first node.

15. The method of claim 14, wherein
- the first transistor comprises a first gate having a first oxide thickness, and
- outputting the voltage comprises outputting the voltage with the source follower transistor comprising a second gate having a second gate thickness less than the first gate thickness.

16. The method of claim 11, wherein outputting the voltage with the source follower transistor comprises using a signal having the second power supply voltage to control the source follower transistor.

17. The method of claim 11, wherein outputting the voltage with the source follower transistor comprises outputting the voltage having a value based on a photodiode voltage reduced by the level shifter.

18. The method of claim 17, wherein the photodiode voltage having the first power supply voltage indicates that the photodiode has not been exposed to light.

19. The method of claim 17, wherein the photodiode voltage having a value below the first power supply voltage indicates that the photodiode has been exposed to light.

20. The method of claim 11, further comprising outputting another voltage with another source follower transistor electrically coupled to the column line, the another voltage being indicative of exposure of another photodiode to light.

* * * * *